(12) United States Patent
Lee

(10) Patent No.: US 7,161,394 B2
(45) Date of Patent: *Jan. 9, 2007

(54) DIGITAL PHASE MIXERS WITH ENHANCED SPEED

(75) Inventor: Seong-hoon Lee, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/204,824

(22) Filed: Aug. 16, 2005

(65) Prior Publication Data

US 2006/0038603 A1 Feb. 23, 2006

Related U.S. Application Data

(63) Continuation of application No. 10/719,348, filed on Nov. 21, 2003, now Pat. No. 6,952,127.

(51) Int. Cl.
*H03B 19/00* (2006.01)

(52) U.S. Cl. ..................... 327/116; 327/119

(58) Field of Classification Search ............. 327/116, 327/119–122, 356, 359; 455/326, 333
See application file for complete search history.

(56) References Cited

U.S. PATENT DOCUMENTS

| | | | |
|---|---|---|---|
| 4,985,639 A | 1/1991 | Renfrow et al. |
| 5,355,097 A | 10/1994 | Scott et al. |
| 5,463,337 A | 10/1995 | Leonowich |
| 5,663,665 A | 9/1997 | Wang et al. |
| 5,751,665 A | 5/1998 | Tanoi |
| 5,789,927 A | 8/1998 | Belcher |
| 5,872,488 A | 2/1999 | Lai |
| 6,100,736 A | 8/2000 | Wu et al. |
| 6,194,916 B1 | 2/2001 | Nishimura et al. |
| 6,194,947 B1 | 2/2001 | Lee et al. |
| 6,295,328 B1 | 9/2001 | Kim et al. |
| 6,313,688 B1 | 11/2001 | Lee et al. |
| 6,326,826 B1 | 12/2001 | Lee et al. |
| 6,366,148 B1 | 4/2002 | Kim |
| 6,393,083 B1 | 5/2002 | Beukema |
| 6,512,408 B1 | 1/2003 | Lee et al. |

(Continued)

OTHER PUBLICATIONS

Jong-Tae Kwak al., "A Low Cost High Performance Register-Controlled Digital DLL for 1 Gbps x32 DDR SDRAM," The 8th Korean Conference on Semiconductors, Feb. 2001.

(Continued)

*Primary Examiner*—Kenneth B. Wells
(74) *Attorney, Agent, or Firm*—Fish & Neave IP Group Ropes & Gray LLP; Michael J. Chasan

(57) ABSTRACT

Digital phase mixers with enhanced speed are provided. A phase mixer generates a signal having a phase between the phases of two input signals based on select signals. The propagation delay of the output signal is reduced by using a first voltage source to drive the input signals and the output signal and a second voltage source, having a higher voltage than the first voltage source, to drive the select signals. The higher voltage source reduces the impedance of each transistor driven by the select signals, thus reducing the propagation delay at the output of the phase mixer. For a non-differential digital phase mixer, the propagation delay is reduced in the rising edges of the output signal. For a differential digital phase mixer, the propagation delay is reduced in the rising and falling edges of the output signal.

22 Claims, 6 Drawing Sheets

U.S. PATENT DOCUMENTS

| | | |
|---|---|---|
| 6,573,771 B1 | 6/2003 | Lee et al. |
| 6,618,283 B1 | 9/2003 | Lin |
| 6,621,315 B1 | 9/2003 | Heo et al. |
| 6,642,760 B1 | 11/2003 | Alon et al. |
| 6,661,863 B1 | 12/2003 | Toosky |
| 6,762,633 B1 | 7/2004 | Lee |
| 6,768,361 B1 | 7/2004 | Kwak |
| 6,791,381 B1 | 9/2004 | Stubbs et al. |
| 6,812,753 B1 | 11/2004 | Lin |
| 6,952,127 B1 * | 10/2005 | Lee ............................ 327/356 |
| 2003/0219088 A1 | 11/2003 | Kwak |
| 2004/0217789 A1 | 11/2004 | Kwak |
| 2005/0110539 A1 | 5/2005 | Lee |
| 2005/0127964 A1 | 6/2005 | Lee |
| 2005/0127965 A1 | 6/2005 | Lee |

OTHER PUBLICATIONS

Ramin Farjad-Rad et al., "A Low-Power Multiplying DLL for Low-Jitter Multigigahertz Clock Generation in Highly Integrated Digital Chips," IEEE Journal of Solid-State Circuits, vol. 37, No. 12, Dec. 2002, pp. 1804-1812.

* cited by examiner

DIGITAL PHASE MIXERS WITH ENHANCED SPEED

CROSS REFERENCE TO RELATED APPLICATION

This is a continuation of commonly-assigned U.S. patent application Ser. No. 10/719,348, filed Nov. 21, 2003, now U.S. Pat. No. 6,952,127.

BACKGROUND OF THE INVENTION

This invention relates to digital signal phase mixers. More particularly, this invention relates to digital phase mixers with enhanced speed.

A phase mixer typically receives two input signals and outputs a signal having a phase between the phases of the two input signals. Select signals can be used to determine the phase of the output signal. The number of bits in the select signals can indicate the is number of possible intermediate phases, equally-spaced apart, that can be generated by the phase mixer. For example, two signals having a respective phase of 45° and 90° can be input to a phase mixer, which can then output a signal having a phase between 45° and 90°. If the select signals each have nine bits, the phase mixer can generate an output signal having one of eight possible intermediate phases (e.g., 50°, 55°, 60°, 65°, 70°, 75°, 80°, and 85°).

One voltage source typically drives the input signals, the select signals, and the output signal. Generation of the output signal typically results in a propagation delay, which increases the desired phase of the output signal. This non-zero propagation delay can impede the high speed performance of a phase mixer.

In view of the foregoing, it would be desirable to provide digital phase mixers with reduced propagation delay.

SUMMARY OF THE INVENTION

It is an object of this invention to provide digital phase mixers with reduced propagation delay.

In accordance with this invention, the propagation delay is reduced by using two different voltage sources to drive a phase mixer. A first voltage source drives the input signals and the output signal, and a second voltage source, having a voltage higher than the first voltage source, drives the select signals. The higher voltage reduces the impedance of each transistor driven by the select signals, thus reducing the propagation delay at the output of the phase mixer.

In one embodiment, an elevated voltage source is applied to a non-differential digital phase mixer, reducing the propagation delay during the rising edges of the output signal.

In another embodiment, an elevated voltage source is applied to a differential digital phase mixer. In this embodiment, a more symmetric performance is achieved, reducing the propagation delay during both the rising and falling edges of the output signal.

The elevated voltage source can be any suitable voltage source. Often, several sources of different voltage levels are available in a system, any one of which can be used as the elevated voltage source. For example, a pumped up voltage source (Vpp) used for a word line in a dynamic random access memory can be used as the elevated voltage source for the phase mixer.

BRIEF DESCRIPTION OF THE DRAWINGS

The above and other objects and advantages of the invention will be apparent upon consideration of the following detailed description, taken in conjunction with the accompanying drawings, in which like reference characters refer to like parts throughout, and in which.

DETAILED DESCRIPTION OF THE INVENTION

Figure 1:
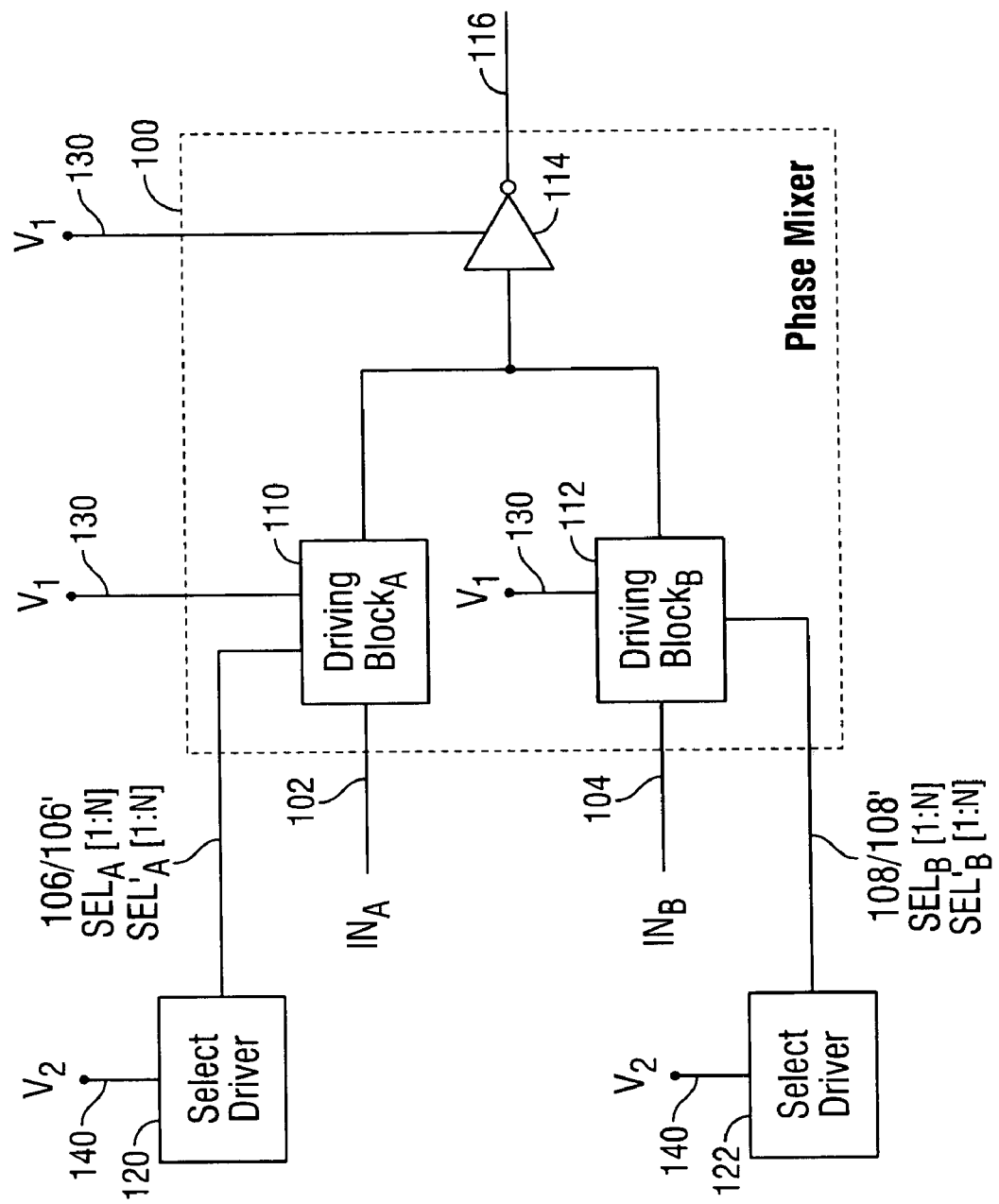
FIG. 1 is a block diagram of a phase mixer in accordance with the invention.

The invention provides digital phase mixers with enhanced speed. FIG. 1 is a block diagram of one embodiment of a digital phase mixer in accordance with the invention. Phase mixer 100 receives two input signals 102 and 104 and two select signals 106 and 108, and outputs a signal 116 having a phase between the phases of input signals 102 and 104. Input signals 102 and 104 can be clock signals, data signals, control signals, or other types of signals. Input signals 102 and 104 can have phases (e.g., 0°, 10°, 36°, 45°, 90°) that are any suitable degrees apart. (Although the invention is described herein primarily in the context of phase (e.g., with units of degrees or radians), the invention may also be described in the context of time (e.g., input signals 102 and 104 can be 100 picoseconds apart)). For more optimal performance, the maximum phase difference between input signals 102 and 104 is preferably less than about two to three times the total propagation delay time of phase mixer 100. The complement of select signals 106 and 108 (i.e., signals 106' and 108') can also be input to phase mixer 100. Alternatively, phase mixer 100 can include circuitry (e.g., inverters) that generates the complement of select signals 106 and 108. Select signals 106/106' and 108/108' can be generated by respective select drivers 120 and 122 or alternatively, by a single select driver.

Select signals 106 and 108 can each include N select bits that can be used to determine the phase of output signal 116 relative to the phases of input signals 102 and 104. N can be any reasonable number (e.g., 5, 10). The larger the value of N, the greater the number of possible intermediate phases that can be generated. However, having too large a value for N increases the amount of circuitry required for phase mixer 100 which can also increase the characteristic load of the circuitry, causing an undesirable change in the frequency of the output.

The select bits in select signals 106 and 108 can be directly related to each other. For example, in an ideal situation, if p out of N select bits are enabled in select signal 106 for input signal 102, then (N–p) select bits are enabled in select signal 108 for input signal 104. The greater the number of select bits enabled for input signal 102, the closer in phase output signal 116 is to input signal 102. The greater the number of select bits enabled for input signal 104, the closer in phase output signal 116 is to input signal 104. If the number of select bits enabled for input signals 102 and 104 are the same, the phase of output signal 116 will be substantially halfway between the phases of input signals 102 and 104. Although select signals 106 and 108 are described herein primarily in the context of separate signals 106 and 108 for clarity, one select signal can be input to phase mixer 100, which can then include circuitry (e.g., inverters) to generate the other select signal.

The phase relationship between input signals 102 and 104 and output signal 116 can be represented by the following equation:

$$\varphi(OUT) = \varphi(IN_A)*(p/N) + \varphi(IN_B)*(N-p)/N + \varphi(T_{PM}) \quad (1)$$
$$= \varphi(IN_A)*K + \varphi(IN_B)*(1-K) + \varphi(T_{PM})$$

$\phi$=Phase
$IN_A$=First input signal 102
$IN_B$=Second input signal 104
OUT=Output signal 116
N=Number of select bits in select signals 106/108
p=Number of select bits enabled for the first input signal 102
K=p/N=Weighting factor for signal $IN_A$
1−K=Weighting factor for signal $IN_B$
$T_{PM}$=Propagation delay time The phase of output signal 116 is the sum of three components. The first component is the phase of the first input signal 102 times its weighting factor (K). The weighting factor for input signal 102 is the number of select bits in select signal 106 that is enabled (p) divided by the total number of select bits (N). The second component is the phase of the second input signal 104 times its weighting factor (1−K). The weighting factor for input signal 104 is the number of select bits in select signal 108 that is enabled (N−p) divided by the total number of select bits (N). The third component is the phase of the total propagation delay ($T_{PM}$), which is determined by multiplying the total propagation delay by 360° (or $2\pi^R$) and dividing the result by the period of input signals 102 and 104. Although not shown, secondary factors may also affect the phase of output signal 116 including, for example, the sizing of the transistors used to implement phase mixer 100.

Phase mixer 100 includes two driving blocks 110 and 112 and an inverter 114. Input signal 102 and select signal 106 are input to driving block 110. Driving block 110 uses select signal 106 to produce an output with a phase that is proportional to the relative weight of input signal 102 to output signal 116. Input signal 104 and select signal 108 are input to a second driving block 112. Driving block 112 uses select signal 108 to produce an output with a phase that is proportional to the relative weight of input signal 104 to output signal 116. The outputs of driving blocks 110 and 112 are coupled such that the s phases of the generated outputs are summed together and input to inverter 114. Inverter 114 inverts the logic state of its input signal (i.e., from binary "1" to binary "0" or from binary "0" to binary "1") to produce output signal 116. A first voltage source ($V_1$) 130 is used to drive input signals 102 and 104, driving blocks 110 and 112, and inverter 114. A second voltage source ($V_2$) 140 is used to drive select drivers 120 and 122.

Figure 2:
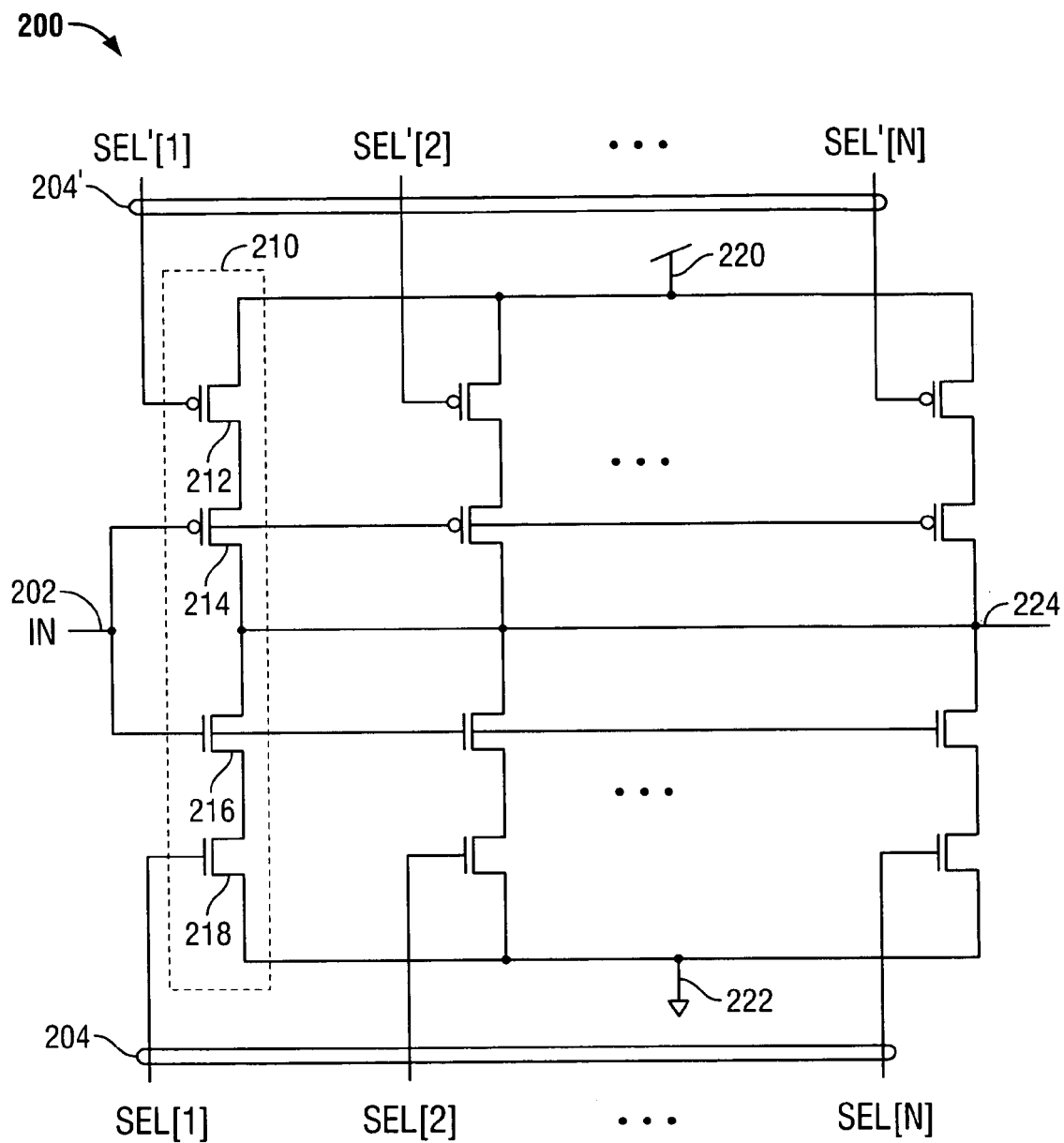
FIG. 2 is a circuit diagram illustrating a portion of the phase mixer of FIG. 1 in accordance with the invention.

Each of driving blocks 110 and 112 can include the circuitry shown in FIG. 2. Driving block 200 receives an input signal 202 (e.g., signal 102 or 104), a select signal 204, and complement select signal 204' (e.g., signals 106/106' or 108/108'). Select signal 204 and its complement signal 204' can each have N select bits. Driving block 200 includes a driving unit 210. The number of driving units 210 can be the number of bits (e.g., N) in select signal 204 or another number. Each driving unit 210 includes two p-channel metal-oxide semiconductor (PMOS) transistors 212 and 214 and two n-channel metal-oxide semiconductor (NMOS) transistors 216 and 218 connected in series between a power voltage 220 and a ground voltage 222. The gate of PMOS transistor 212 is coupled to receive one of the bits of complement signal 204' while the source is connected to power voltage 220. The gate of NMOS transistor 218 is coupled to receive a corresponding bit of select signal 204 while the source is connected to ground voltage 222. The gates of PMOS transistor 214 and NMOS transistor 216 in each driving unit 210 are coupled to an input node 202 while the drains are tied to an output node 224. (A signal received at node 202 will hereinafter be referred to as signal 202 while a signal output from node 224 will hereinafter be referred to as signal 224.)

In accordance with the invention, two different voltage sources are used. A first voltage source (e.g., voltage $V_1$ 130, power voltage 220) is used to drive input signal 202 and output signal 224. A second voltage source (e.g., voltage $V_2$ 140), having a voltage higher than the first voltage source, is used to drive select signal 204 and complement signal 204' (e.g., the enabled select bits). Accordingly, select signal 204 and complement signal 204' have a higher logical 1 voltage than input signal 202 and output signal 224. The higher voltage reduces the impedance of each NMOS transistor 218 driven by select signal 204, thus reducing the propagation delay at the falling edge of output signal 224. Because output signal 224 is sent to inverter 114, the propagation delay of phase mixer 100 is therefore reduced at the rising edge of output signal 116. The elevated voltage source can be any suitable voltage source. There are often several sources of different voltage levels available in a system, any one of which can be used as the elevated voltage source. For example, a pumped up voltage source (Vpp) used for a word line in a dynamic random access memory can be used as the elevated voltage source for the phase mixer.

Figure 3:
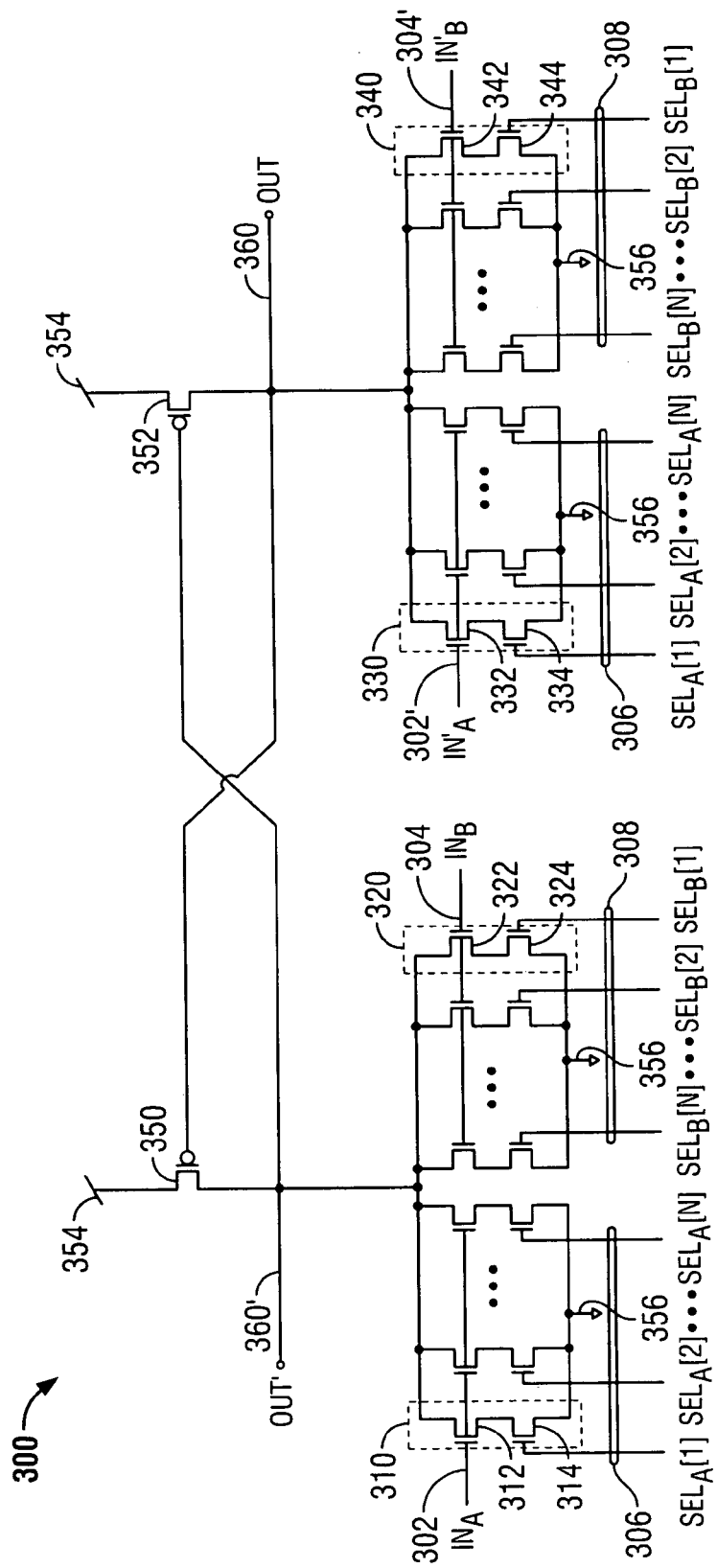
FIG. 3 is a circuit diagram illustrating another embodiment of a phase mixer in accordance with the invention.

FIG. 3 illustrates a differential digital phase mixer 300 in accordance with the invention. Phase mixer 300 receives a first input signal 302, complement input signal 302', and a select signal 306 having N select bits. Phase mixer 300 also receives a second input signal 304, complement input signal 304', and a select signal 308 having N select bits.

Phase mixer 300 includes a block 310 of two NMOS transistors 312 and 314 connected in series, a block 320 of two NMOS transistors 322 and 324 connected in series, a block 330 which is the mirror image of block 310, a block 340 which is the mirror image of block 320, and two PMOS transistors 350 and 352. The number of blocks 310 and 330 can each be the number of bits (e.g., N) in select signal 306 or any other suitable number. The number of blocks 320 and 340 can each be the number of bits (e.g., N) in select signal 308 or any other suitable number.

In block 310, the gate of NMOS transistor 314 is coupled to receive one of the select bits of select signal 306 while the source is connected to a ground voltage 356. The gate of NMOS transistor 312 is coupled to receive first input signal 302 while the drain is coupled to the drain of PMOS transistor 350.

In block 320, the gate of NMOS transistor 324 is coupled to receive one of the select bits of select signal 308 while the source is connected to ground voltage 356. The gate of NMOS transistor 322 is coupled to receive second input signal 304 while the drain is coupled to the drain of PMOS transistor 350.

In block 330, the gate of NMOS transistor 334 is coupled to receive the same select bit from select signal 306 as NMOS gate 314 in block 310. The gate of NMOS transistor 332 is coupled to receive complement input signal 302' while the drain is coupled to the drain of PMOS transistor 352.

In block 340, the gate of NMOS transistor 344 is coupled to receive the same select bit from select signal 308 as NMOS gate 324 in block 320. The gate of NMOS transistor 342 is coupled to receive complement input signal 304' while the drain is coupled to the drain of PMOS transistor 352.

The sources of PMOS transistors 350 and 352 are connected to a power voltage 354. The drains of PMOS transistor 352 and NMOS transistors 332 and 342 are tied to output node 360, which is used to drive the gate of PMOS transistor 350. (A signal output from node 360 will hereinafter be referred to as signal 360). The drains of PMOS transistor 350 and NMOS transistors 312 and 322 are tied to complementary output node 360', which is used to drive the gate of PMOS transistor 352. (A signal output from complementary output node 360' will hereinafter be referred to as complementary signal 360').

Although the invention is described herein primarily in the context of PMOS and NMOS transistors (e.g., in FIGS. 2 and 3), any suitable gate or combination of gates may be used to implement a phase mixer in accordance with the invention.

Similar to that described in connection with FIG. 2, two different voltage sources are used. A first voltage source (e.g., power voltage 354) is used to drive input signals 302 and 304, their respective complements 302' and 304', output signal 360, and its complement 360'. A second voltage source, having a voltage higher than the first voltage source, is used to drive select signals 306 and 308 (e.g., the enabled select bits). Accordingly, select signals 306 and 308 have a higher logical 1 voltage than input signals 302 and 304, their respective complements 302' and 304', output signal 360, and its complement 360'. Because phase mixer 300 uses differential circuitry, a more symmetric output signal 360 is achieved, resulting in a reduced propagation delay in the rising edges and falling edges of output signal 360. The elevated voltage source can be any suitable voltage source.

Figure 4:
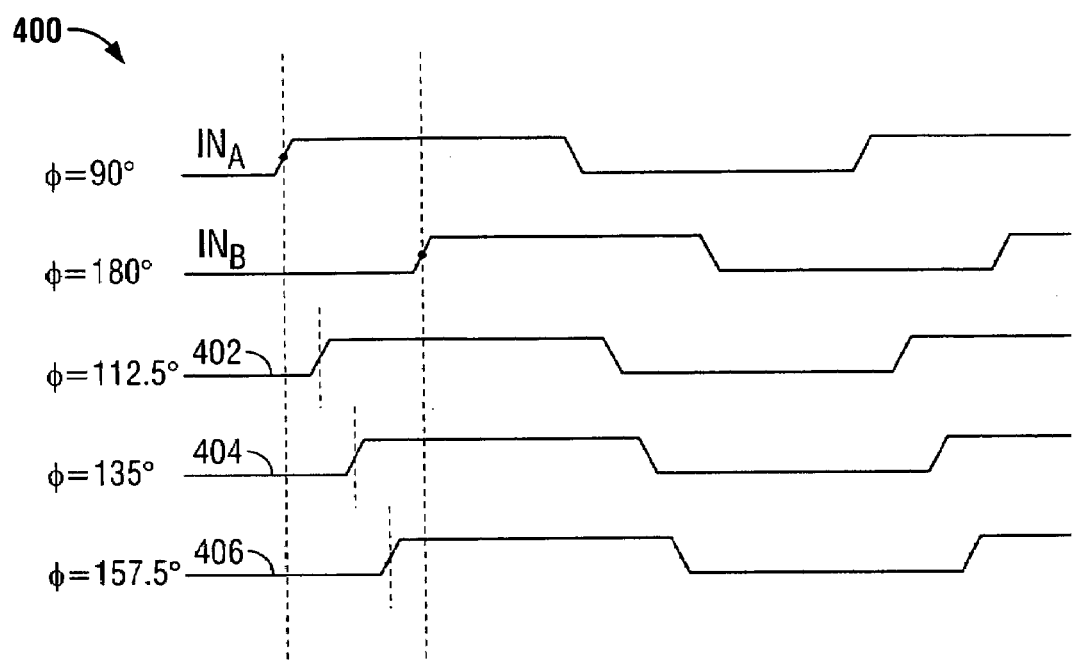
FIGS. 4–5 are timing diagrams of input and output signals of different embodiments of a phase mixer in accordance with the invention.

FIG. 4 shows a timing diagram 400 illustrating the operation of an ideal phase mixer that has zero propagation delay. For example, suppose a first input signal $IN_A$ (e.g., signal 102 or 302) has a phase of 90° and a second input signal $IN_B$ (e.g., signal 104 and 304) has a phase of 180° such that the phase difference between the two input signals is 90°. Suppose also that two select signals (e.g., signals 106/108 or 306/308) each have four select bits (e.g., N=4). With four select bits, a phase mixer (e.g., phase mixer 100 or 300) can generate an output signal that has the same phase as either one of the input signals or one of three intermediate phases (e.g., 112.5°, 135°, or 157.5°) If four select bits (e.g., p=4) are enabled for the first input signal $IN_A$, the phase mixer can output the first input signal $IN_A$. If three select bits (e.g., p=3) are enabled for the first input signal $IN_A$, and one select bit is enabled for the second input signal $IN_B$, the phase mixer can output a signal 402 having a phase (e.g., 112.5°) between the phases of the two input signals, but closer to the phase of the first input signal $IN_A$. If two select bits (e.g., p=2) are enabled for the first input signal $IN_A$, and two select bits are enabled for the second input signal $IN_B$, the phase mixer can output a signal 404 having a phase (e.g., 135°) halfway between the phases of the two input signals. If one select bit (e.g., p=1) is enabled for the first input signal $IN_A$, and three select bits are enabled for the second input signal $IN_B$, the phase mixer can output a signal 406 having a phase (e.g., 157.5°) between the phases of the two input signals, but closer to the phase of the second input signal $IN_B$. If four select bits are enabled for the second input signal $IN_B$, the phase mixer can output the second input signal $IN_B$.

Although FIG. 4 is described herein primarily in the context of a phase mixer with two input signals 90° apart in phase and with select signals having four select bits (for clarity), the two input signals to the phase mixer can be of other degrees apart in phase and have other numbers of select bits.

Figure 5:
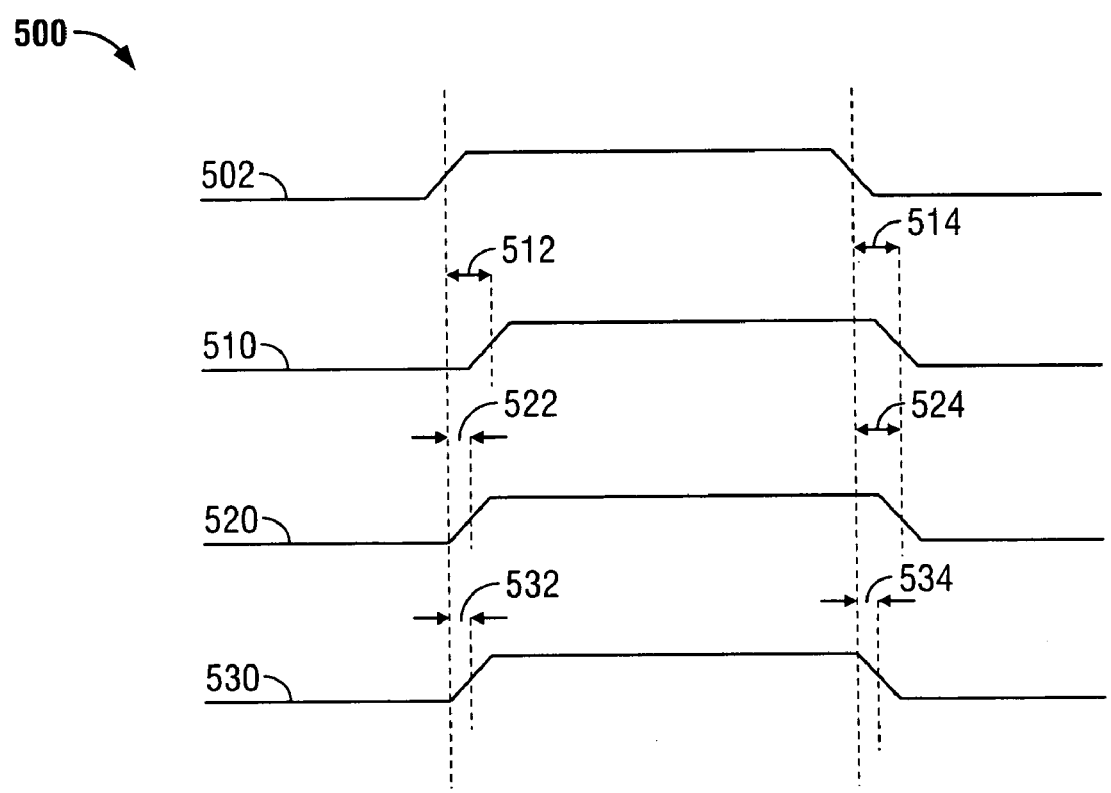

FIG. 5 shows a timing diagram 500 illustrating the operation of an embodiment of a phase mixer having non-zero propagation delay in accordance with the invention. In an ideal phase mixer, the phase mixer can output a signal 502 having an intermediate phase with zero propagation delay (e.g., $\phi(T_{PM})=0$) such that $\phi(OUT)=\phi(IN_A)*k+\phi(IN_B)*(1-k)$. In a conventional, non-differential phase mixer that uses one voltage source, the phase mixer outputs a signal 510 whose rising edge is delayed from the ideal phase by a propagation delay time 512 and whose falling edge is delayed by a propagation delay time 514. Propagation delay times 512 and 514 can be the same or different.

In one embodiment of the invention, for a non-differential phase mixer that uses different voltage sources as shown in FIGS. 1 and 2, phase mixer 100 outputs a signal 520 whose rising edge is delayed from the ideal phase by a propagation delay time 522 and whose falling edge is delayed by a propagation delay time 524. The propagation delay time 522 in the rising edge of signal 520 is less than the propagation delay time 512 in the rising edge of signal 510.

In another embodiment of the invention, for a differential phase mixer that uses different voltage sources as shown in FIG. 3, phase mixer 300 outputs a signal 530 whose rising edge is delayed from the ideal phase by a propagation delay time 532 and whose falling edge is delayed by a propagation delay time 534. The propagation delay times 532 and 534 in the respective rising and falling edges of signal 530 are less than the propagation delay times 512 and 514 in the respective rising and falling edges of signal 510. Propagation delay times 532 and 534 can be the same or different.

Phase mixers 100 or 300 can perform phase mixing for any suitable purpose such as, for example, for generating a signal having a particular phase that is not readily available in a given circuit, for fine tuning adjustments of an input signal, and for synchronizing output data with an external clock signal. Phase mixers 100 or 300 can be implemented as dedicated circuitry or as part of other circuitry. For example, phase mixers 100 or 300 can be implemented in a digital delay-locked loop circuit, a frequency multiplying digital delay-locked loop circuit, or another suitable circuit.

The circuits on which phase mixers 100 or 300 are implemented can be peripherals that are part of a semiconductor random access memory (RAM) such as dynamic RAM (DRAM) or a synchronous DRAM (SDRAM).

Figure 6:
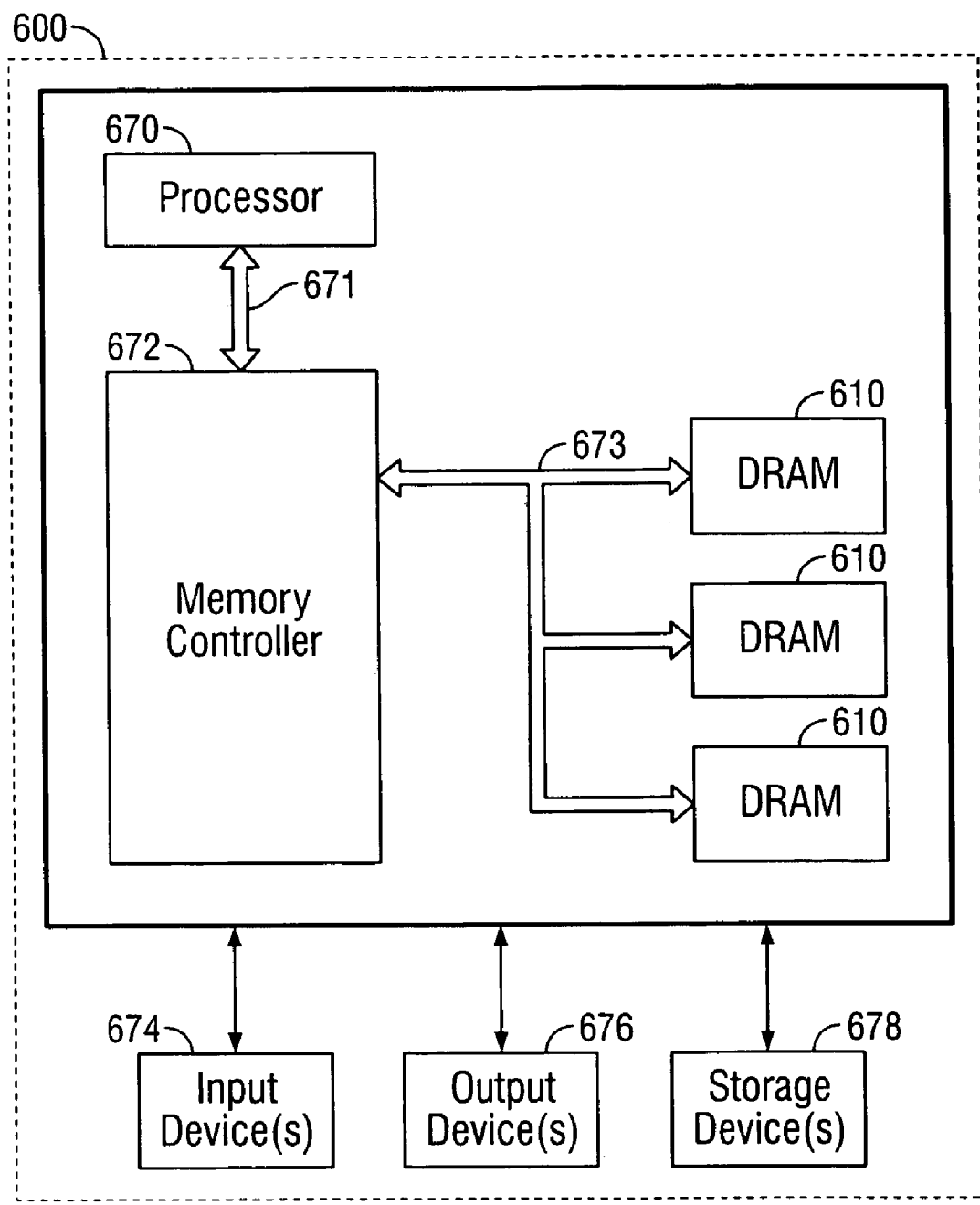
FIG. 6 is a block diagram of a system that incorporates the invention.

FIG. 6 shows a system that incorporates the invention. System 600 includes a plurality of DRAM chips 610, a processor 670, a memory controller 672, input devices 674, output devices 676, and optional storage devices 678. Data and control signals are transferred between processor 670 and memory controller 672 via bus 671. Similarly, data and control signals are transferred between memory controller 672 and DRAM chips 610 via bus 673. One or more DRAM chips 610 include a phase mixer in accordance with the invention. Input devices 674 can include, for example, a keyboard, a mouse, a touch-pad display screen, or any other appropriate device that allows a user to enter information into system 600. Output devices 676 can include, for example, a video display unit, a printer, or any other appropriate device capable of providing output data to a user. Note that input devices 674 and output devices 676 can alternatively be a single input/output device. Storage devices 678 can include, for example, one or more disk or tape drives.

Note that the invention is not limited to DRAM chips, but is applicable to other integrated circuit chips that implement phase mixers in accordance with the invention.

Thus it is seen that digital phase mixers with reduced propagation delay using an additional elevated voltage source are provided. One skilled in the art will appreciate that the invention can be practiced by other than the described embodiments, which are presented for purposes of illustration and not of limitation, and the present invention is limited only by the claims which follow.

I claim:

1. A memory having embodied thereon circuitry comprising:
   a digital phase mixer having a first input operative to receive a first input signal having a first phase, a second input operative to receive a second input signal having a second phase, a third input operative to receive a first select signal, a fourth input operative to receive a second select signal, and an output, said digital phase mixer generating a signal at said output having a third phase between said first phase and said second phase based on said first select signal and said second select signal;
   a first voltage source coupled to said phase mixer;
   a second voltage source coupled to drive said first select signal and said second select signal, wherein said second voltage source has a voltage greater than said first voltage source; and
   a ground voltage coupled to said phase mixer.

2. The memory of claim of 1 wherein said first select signal and said second select signal each comprises a same predetermined number of bits.

3. The memory of claim 2 wherein:
   said first select signal has a first number of bits enabled; and
   said second select signal has a second number of bits enabled.

4. The memory of claim 3 wherein a sum of said first number and said second number is said predetermined number.

5. The memory of claim 3 wherein:
   when said first number is greater than said second number, said third phase is closer in phase to said first phase than said second phase;
   when said first number is substantially equal to said second number, said third phase is substantially halfway between said first phase and said second phase; and
   when said first number is less than said second number, said third phase is closer in phase to said second phase than said first phase.

6. The memory of claim 1 wherein said digital phase mixer comprises:
   a first driving block operative to receive said first input signal and said first select signal, and to output a signal having a first phase relationship to said first phase based on said first select signal;
   a second driving block operative to receive said second input signal and said second select signal, and to output a signal having a second phase relationship to said second phase based on said second select signal; and
   an inverter operative to receive said signal from said first driving block and said signal from said second driving block, and to output said signal having said third phase.

7. The memory of claim 6 wherein said first driving block comprises:
   a first NMOS transistor connected to said ground voltage and having a gate coupled to receive a bit from said first select signal;
   a second NMOS transistor connected in series to said first NMOS transistor;
   a first PMOS transistor connected to said first voltage source and having a gate coupled to receive a complement of said bit from said first select signal; and
   a second PMOS transistor connected in series to said first PMOS transistor, said second PMOS transistor and said second NMOS transistor having their gates coupled to a node that receives said first input signal and having their drains coupled to a node that outputs said output of said first driving block.

8. The memory of claim 6 wherein said second driving block comprises:
   a first NMOS transistor connected to said ground voltage and having a gate coupled to receive a bit from said second select signal;
   a second NMOS transistor connected in series to said first NMOS transistor;
   a first PMOS transistor connected to said first voltage source and having a gate coupled to receive a complement of said bit from said second select signal; and
   a second PMOS transistor connected in series to said first PMOS transistor, said second PMOS transistor and said second NMOS transistor having their gates coupled to a node that receives said second input signal and having their drains coupled to a node that outputs said output of said second driving block.

9. The memory of claim 6 wherein:
   said first phase relationship is a proportionate weight of said first phase based on a number of bits in said first select signal that is enabled; and
   said second phase relationship is a proportionate weight of said second phase based on a number of bits in said second select signal that is enabled.

10. The memory of claim 1 wherein said digital phase mixer is differential.

11. The memory of claim 10 further comprising:
    a first NMOS transistor connected to said ground voltage and having a gate coupled to receive a bit from said first select signal;
    a second NMOS transistor, connected in series to said first NMOS transistor, having a gate coupled to receive said first input signal;
    a third NMOS transistor connected to said ground voltage and having a gate coupled to receive a bit from said second select signal;
    a fourth NMOS transistor, connected in series to said third NMOS transistor, having a gate coupled to receive said second input signal;
    a first PMOS transistor having a source connected to said first voltage source and a drain coupled to drains of said second NMOS transistor and said fourth NMOS transistor at a complement output node that outputs a complement of said output;
    a fifth NMOS transistor connected to said ground voltage and having a gate coupled to receive said bit from said first select signal;

a sixth NMOS transistor, connected in series to said fifth NMOS transistor, having a gate coupled to receive a complement of said first input signal;
a seventh NMOS transistor connected to said ground voltage and having a gate coupled to receive said bit from said second select signal;
an eighth NMOS transistor, connected in series to said seventh NMOS transistor, having a gate coupled to receive a complement of said second input signal; and
a second PMOS transistor having a source connected to said first voltage source and a drain coupled to drains of said sixth NMOS transistor and said eighth NMOS transistor at an output node that outputs said output, said first PMOS transistor having a gate coupled to said output node and said second PMOS transistor having a gate coupled to said complement output node.

12. The memory of claim 1 wherein:
said first voltage source is operative to drive a first voltage to said first input signal, said second input signal, and said output; and
said second voltage source is operative to drive a second voltage to said first select signal and said second select signal.

13. A memory having embodied thereon a digital phase mixer comprising:
a first driving block having a first input operative to receive a first input signal having a first phase, a second input operative to receive a first control signal, and an output, said first control signal having a higher logical 1 voltage than said first input signal, said first driving block generating a first signal at said output having a first phase relationship to said first phase based on said first control signal;
a second driving block having a first input operative to receive a second input signal having a second phase, a second input operative to receive a second control signal, and an output, said second control signal having a higher logical 1 voltage than said second input signal, said second driving block generating a second signal at said output having a second phase relationship to said second phase based on said second control signal; and
an inverter having an input coupled to said first driving block output and said second driving block output, said inverter having an output and operative to generate a third signal at said output having a third phase between said first phase and said second phase.

14. The memory of claim 13 wherein said first control signal and said second control signal each comprises a same predetermined number of bits.

15. The memory of claim 14 wherein:
said first control signal has a first number of bits enabled; and
said second control signal has a second number of bits enabled.

16. The memory of claim 15 wherein a sum of said first number and said second number is said predetermined number.

17. The memory of claim 15 wherein:
when said first number is greater than said second number, said third phase is closer in phase to said first phase than said second phase;
when said first number is substantially equal to said second number, said third phase is substantially halfway between said first phase and said second phase; and when said first number is less than said second number, sail third phase is closer in phase to said second phase than said first phase.

18. The memory of claim 13 wherein said first driving block comprises:
a first NMOS transistor connected to a ground voltage and having a gate coupled to receive a bit from said first control signal;
a second NMOS transistor connected in series to said first NMOS transistor;
a first PMOS transistor connected to said first voltage source and having a gate coupled to receive a complement of said bit from said first control signal; and
a second PMOS transistor connected in series to said first PMOS transistor, said second PMOS transistor and said second NMOS transistor having their gates coupled to a node that receives said first input signal and having their drains coupled to a node that outputs said output of said first driving block.

19. The memory of claim 13 wherein said second driving block comprises:
a first NMOS transistor connected to a ground voltage and having a gate coupled to receive a bit from said second control signal;
a second NMOS transistor connected in series to said first NMOS transistor;
a first PMOS transistor connected to said first voltage source and having a gate coupled to receive a complement of said bit from said second control signal; and
a second PMOS transistor connected in series to said first PMOS transistor, said second PMOS transistor and said second NMOS transistor having their gates coupled to a node that receives said second input signal and having their drains coupled to a node that outputs said output of said second driving block.

20. The memory of claim 13 wherein:
said first phase relationship is a
proportionate weight of said first phase based on a number of bits in said first control signal that is enabled; and
said second phase relationship is a
proportionate weight of said second phase based on a number of bits in said second control signal that is enabled.

21. A dynamic random access memory having embodied thereon circuitry comprising:
a digital phase mixer having a first input operative to receive a first input signal having a first phase, a second input operative to receive a second input signal having a second phase, a third input operative to receive a first select signal, a fourth input operative to receive a second select signal, and an output, said digital phase mixer generating a signal at said output having a third phase between said first phase and said second phase based on said first select signal and said second select signal;
a first voltage source coupled to said phase mixer;
a second voltage source coupled to drive said first select signal and said second select signal, wherein said second voltage source has a voltage greater than said first voltage source; and
a ground voltage coupled to said phase mixer.

22. A dynamic random access memory having embodied thereon a digital phase mixer comprising:
a first driving block having a first input operative to receive a first input signal having a first phase, a second input operative to receive a first control signal, and an output, said first control signal having a higher logical 1 voltage than said first input signal, said first driving block generating a first signal at said output having a first phase relationship to said first phase based on said first control signal;

a second driving block having a first input operative to receive a second input signal having a second phase, a second input operative to receive a second control signal, and an output, said second control signal having a higher logical 1 voltage than said second input signal, said second driving block generating a second signal at said output having a second phase relationship to said second phase based on said second control signal; and an inverter having an input coupled to said first driving block output and said second driving block output, said inverter having an output and operative to generate a third signal at said output having a third phase between said first phase and said second phase.

* * * * *

UNITED STATES PATENT AND TRADEMARK OFFICE
CERTIFICATE OF CORRECTION

PATENT NO. : 7,161,394 B2  
APPLICATION NO. : 11/204824  
DATED : January 9, 2007  
INVENTOR(S) : Seong-hoon Lee Page 1 of 1

It is certified that error appears in the above-identified patent and that said Letters Patent is hereby corrected as shown below:

On The Title Page Item (56), In "Jong-Tai Kwak" add --et-- before "al.".

On The Title Page Item (56) Second page, In "6,762,633 B1" change "7/2004" to --7/2003--.

Column 1, line 8, add --copending,-- before "commonly-assigned".

Column 1, line 21, delete "is".

Column 3, line 16, change "Φ" to --φ--.

Column 3, line 54, delete "s".

Signed and Sealed this

First Day of April, 2008

JON W. DUDAS  
*Director of the United States Patent and Trademark Office*